US007046519B2

(12) United States Patent
Nakamura

(10) Patent No.: US 7,046,519 B2
(45) Date of Patent: May 16, 2006

(54) SMALL CARD ADAPTOR AND HOST APPARATUS FOR INSERTION OF THE SAME

(75) Inventor: Masahiro Nakamura, Itami (JP)

(73) Assignee: Matsusita Electric Industrial Co., Ltd., Osaka (JP)

( * ) Notice: Subject to any disclaimer, the term of this patent is extended or adjusted under 35 U.S.C. 154(b) by 266 days.

(21) Appl. No.: 10/454,981

(22) Filed: Jun. 5, 2003

(65) Prior Publication Data

US 2004/0161978 A1 Aug. 19, 2004

(30) Foreign Application Priority Data

Feb. 13, 2003 (JP) ............................ 2003-035658

(51) Int. Cl.
*H05K 1/14* (2006.01)

(52) U.S. Cl. ......................... 361/737; 361/727; 710/35

(58) Field of Classification Search ................ 361/737, 361/683–686, 715, 727; 711/103, 170; 439/945; 710/35

See application file for complete search history.

(56) References Cited

U.S. PATENT DOCUMENTS

| | | | | |
|---|---|---|---|---|
| 6,457,647 | B1 * | 10/2002 | Kurihashi et al. | 235/486 |
| 6,687,783 | B1 * | 2/2004 | Takahashi | 711/103 |
| 6,691,183 | B1 * | 2/2004 | Ryan, Jr. | 710/35 |
| 6,776,345 | B1 * | 8/2004 | Liang | 235/486 |
| 2003/0137805 | A1 * | 7/2003 | Wu | 361/686 |
| 2004/0257756 | A1 * | 12/2004 | Mills et al. | 361/683 |

FOREIGN PATENT DOCUMENTS

JP 2000-092147 3/2000

* cited by examiner

*Primary Examiner*—Kamand Cuneo
*Assistant Examiner*—Hung S. Bui
(74) *Attorney, Agent, or Firm*—Hamre, Schumann, Mueller & Larson, P.C.

(57) ABSTRACT

A small card adaptor into which a small card is inserted so as to be connected to a personal computer includes a small card identifying portion for identifying the kind of the inserted small card, and a controller for receiving an instruction issued by the personal computer based on the kind of the small card identified by the small card identifying portion and transferring the received instruction to the small card.

20 Claims, 7 Drawing Sheets

Parameters issued in the case of transfer of 1 to 511 bytes

| Register | 7 | 6 | 5 | 4 | 3 | 2 | 1 | 0 |
|---|---|---|---|---|---|---|---|---|
| Features | Command Argument 1 (B39:32) | | | | | | | |
| Sector Count | Command Argument 2 (B31:24) | | | | | | | |
| Sector Number | Command Argument 3 (B23:16) | | | | | | | |
| Cylinder Low | Command Argument 4 (B15:8) | | | | | | | |
| Cylinder High | DATA | DIR | Command INDEX (B45:40) | | | | | |
| Device/Head | Data Transfer Length | | | | | | | |
| Command | Command code transmitted to an adaptor (e. g., FAh) | | | | | | | |

Parameters issued in the case of transfer of up to 512 bytes

| Register | 7 | 6 | 5 | 4 | 3 | 2 | 1 | 0 |
|---|---|---|---|---|---|---|---|---|
| Features | Command Argument 1 (B39:32) | | | | | | | |
| Sector Count | Command Argument 2 (B31:24) | | | | | | | |
| Sector Number | Command Argument 3 (B23:16) | | | | | | | |
| Cylinder Low | Command Argument 4 (B15:8) | | | | | | | |
| Cylinder High | DATA | DIR | Command INDEX (B45:40) | | | | | |
| Device/Head | Data Transfer Length | | | | | | | |
| Command | Command code transmitted to an adaptor (e. g., FBh) | | | | | | | |

FIG. 7

SMALL CARD ADAPTOR AND HOST APPARATUS FOR INSERTION OF THE SAME

BACKGROUND OF THE INVENTION

1. Field of the Invention

The present invention relates to a small card adaptor into which a small card is inserted so as to be connected to a host apparatus.

2. Description of the Related Art

Recently, small cards are being used in personal computers, digital cameras, PDA (Personal Digital Assistance), handy terminals (data recording apparatus having a function of inputting data on the spot and sending data through a communication line or the like), and the like. In digital cameras, SD (Secure Digital) memory cards and the like that do not comply with the PC card ATA standards interface are used often as small memory cards for the purpose of storing image data. Small card adaptors for allowing image data stored in such small memory cards to be read/rewritten by personal computers also are used often. Furthermore, in the PDA, small communication cards such as SD card type small cards with a PHS (Personal Handy phone System) built therein, which do not comply with the PC card ATA standards interface, are used for the Internet and mail. Small card adaptors allowing the same small communication cards to be used in personal computers are used often.

In a conventional small card adaptor with a small memory card inserted therein, through a register group complying with the PC card ATA standards interface, a control program or a control logic of a controller provided in the small card adaptor interprets an instruction such as writing and reading of data from a host computer, converts the instruction into a command that can be interpreted by the inserted small memory card, and issues the converted command to the small memory card.

For example, when a small card adaptor with a SD memory card inserted therein is connected to a host computer with a Windows (Trade Name) OS mounted thereon, the host computer reads CIS (Card Information Structure) information based on the PC card ATA standards interface described in a PC Card Standard from the small card adaptor. Then, the host computer selects driver software for the PC card ATA standards interface of the OS, based on the read CIS information. Then, in the case where the host computer instructs the small card adaptor to write the data of an image file, the small card adaptor uses a control program provided therein to interpret the contents of the instruction, create a command code to be written in a region called a Command Index and a value of a parameter such as an Argument used with the command code in the small card adaptor, and give an instruction to the small memory card. Furthermore, the small card adaptor returns the results of the processing by the small memory card to the host computer through the PC card ATA standards interface. Thus, an image file can be stored and read.

In a conventional small card adaptor for data communication, a control program of a memory provided in a small communication card adaptor is rewritten in accordance with a wireless telephone apparatus to be connected, and data communication processing can be performed in accordance with the rewritten control program (e.g., see JP 2000-92147 A).

Furthermore, as an application, there is a small card adaptor capable of being connected to a small communication card instead of a wireless telephone apparatus. As an interface for a small card adaptor to be electrically connected to a host computer, a serial port interface for a modem or a network adaptor interface for a LAN card is used.

For example, when a small card adaptor with a SD card type small card containing a PHS communication function inserted therein is connected to a host computer with a Windows OS mounted thereon, CIS information for a serial port interface described in a PC Card Standard is read from a small card adaptor, and the host computer selects driver software for a serial port of an OS, based on the read CIS information. Then, in the case where the host computer instructs the small card adaptor to write data in a Transmitter Holding Register, the small card adaptor uses a control program provided therein to interpret the contents of the instruction, create a command code to be written in a region called a Command Index and a value of a parameter such as an Argument used with the command code in the small card adaptor, and give an instruction to the SD card type small card in which a PHS communication function is built.

Furthermore, the small card adaptor returns the results of the processing by the SD card type small card with a PHS communication function built therein to the host computer using a serial port interface of the small card adaptor. Thus, the Internet and electronic mail can be used.

However, in the above-mentioned conventional small card adaptor into which a small communication card is inserted is varied in terms of specifications due to the difference in the kind and function of small communication cards to be inserted. Therefore, it is required to change a control program and a control logic of a controller stored in a memory provided in the small card adaptor on the basis of the difference in the kind and function of small communication cards.

An example will be described regarding the above problem. Parameters such as a Command Index and an Argument set for access to a SD card type small card with a PHS communication function built therein, developed by A company cannot be used for a SD card type small card with a PHS communication function built therein and a SD card type small card with a wireless LAN communication function built therein, developed by B company. Therefore, it is required to write and hold a control program changed so as to be compatible with the parameters such as a Command Index and an Argument in a memory provided in a small card adaptor. Therefore, when the capacity of a memory provided in the small card adaptor is small, there is a possibility that the function of the control program may be limited. In contrast, when the function of the control program is set so as to be expanded, it is necessary to increase the capacity of a memory. Therefore, a small card adaptor may become expensive.

Furthermore, conventionally, a user having both a small communication card and a small memory card needs to own both a small card adaptor for a small communication card and a small card adaptor for a small memory card. Therefore, it is inconvenient to carry and handle a small card adaptor.

In the above case, producing a small card adaptor capable of using both a small communication card and a small memory card might be considered. However, a small card adaptor for a small communication card and a small card adaptor for a small memory card are composed of a register group based on different respective interfaces. Therefore, when a small communication card is inserted, it is necessary to set a small card adaptor having a register group based on an interface generally used in communication through a serial port interface and a network adaptor. Furthermore, when a small memory card is inserted, it is necessary to set a small card adaptor having a register group based on the PC card ATA standards interface.

However, with the above-mentioned configuration, a complicated controller or a large-scale control program for controlling so that the processing for a small communication card and the processing for a small memory card can be performed in a small card adaptor. As a result, the capacity of a memory storing it is increased, and the number of gates of a controller provided in a small card adaptor is increased. Thus, a small card adaptor becomes expensive.

Therefore, with the foregoing in mind, it is an object of the present invention to provide a small card adaptor in which driver software for a small card inserted in a small card adaptor is changed appropriately so as to operate normally, whose a production cost is decreased, and a host apparatus into which the small card adaptor is inserted.

SUMMARY OF THE INVENTION

A small card adaptor into which a small card is inserted so as to be connected to a host apparatus according to the present invention includes: a small card identifying portion for identifying a kind of the inserted small card; and a controller for receiving an instruction issued by the host apparatus based on the kind of the small card identified by the small card identifying portion and transferring the received instruction to the small card.

A host apparatus into which the above-mentioned small card adaptor is inserted according to the present invention includes: an adaptor slot for receiving the small card adaptor; and driver software for issuing the instruction to be transferred to the small card based on the kind of the small card identified by the small card identifying portion provided in the small card adaptor.

These and other advantages of the present invention will become apparent to those skilled in the art upon reading and understanding the following detailed description with reference to the accompanying figures.

BRIEF DESCRIPTION OF THE DRAWINGS

FIG. 7 shows examples of parameters set in a register group of a controller provided in a small card adaptor, by driver software provided in the personal computer according to the present embodiment.

DESCRIPTION OF THE PREFERRED EMBODIMENTS

Figure 1:
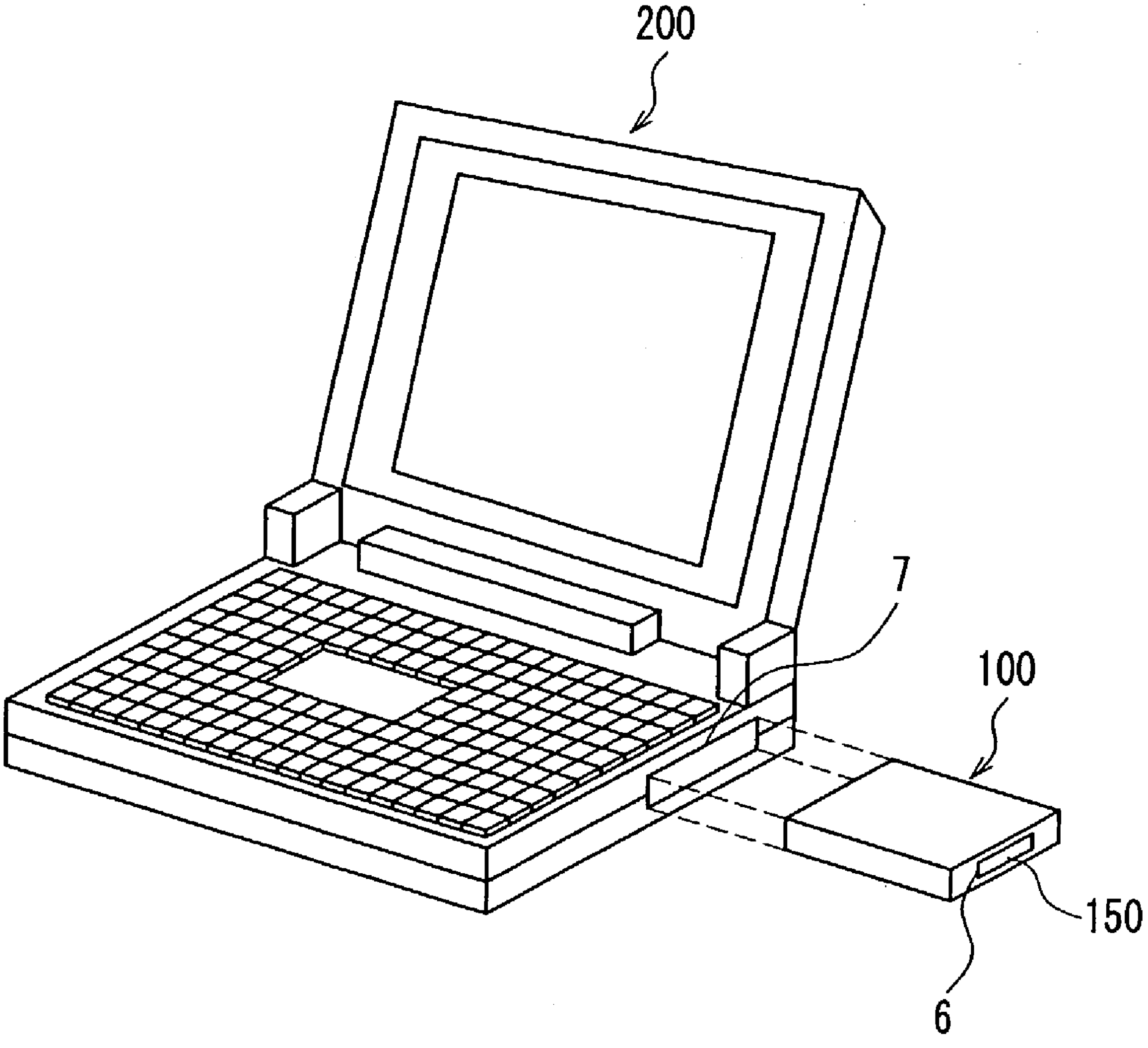
FIG. 1 is a perspective view showing an outer appearance of a small card adaptor according to the present embodiment and a personal computer into which the small card adaptor is inserted.

In a small card adaptor according to the present embodiment, a controller receives an instruction issued by a host apparatus based on the kind of a small card identified by a small card identifying portion and transfers the received instruction to the small card. Therefore, the host apparatus issues an instruction to the small card in accordance with the kind of the small card inserted. Therefore, the small card adaptor is not required to have control programs in accordance with the kind of the small card inserted. As a result, an inexpensive small card adaptor is obtained, which can be operated with a plurality of kinds of small cards inserted therein.

It is preferable that the controller gives a result of processing, performed by the small card based on the instruction transferred from the controller, to the host apparatus.

It is preferable that the small card adaptor is inserted into an adaptor slot provided in the host apparatus, and the small card is inserted into a card slot provided in the small card adaptor.

It is preferable that the instruction issued by the host apparatus includes a command code and a parameter for giving an instruction to the small card, and the controller includes a plurality of registers for setting the command code and the parameter.

It is preferable that the plurality of registers are configured so as to comply with a PC card ATA standards interface.

It is preferable that the controller includes a small card interface control portion for transferring the command code and the parameter set in the plurality of registers to the small card.

It is preferable that the plurality of registers include a Status Register provided with a DRDYbit, and the host apparatus sets the DRDYbit provided in the Status Register in accordance with the result of identification of the kind of the small card by the small card identifying portion.

It is preferable that the small card includes a communication card for communication of the host apparatus through an electric communication line and a memory card for storing image data, when the kind of the small card identified by the small card identifying portion is the communication card, the host apparatus sets the DRDYbit provided in the Status Register to be zero, and when the kind of the small card identified by the small card identifying portion is the memory card, the host apparatus sets the DRDYbit provided in the Status Register to be 1.

It is preferable that the communication card is communicated through a wireless electric communication line.

It is preferable that the communication card is any one selected from the group consisting of a wireless LAN card, a PHS card, a modem card, a LAN card, a GPS card, a Bluetooth card, a camera card, a scanner card, and an IO card.

It is preferable that the controller is provided with a CIS (Card Information Structure) information storing region in which CIS information is stored in accordance with the kind of the small card.

It is preferable that the host apparatus reads the CIS information stored in the CIS information storing region, and issues the instruction based on the read CIS information.

It is preferable that the kind of the small card includes a communication card for communication of the upper apparatus through an electric communication line, and a memory card for storing image data.

It is preferable that the memory card is a SD (Secure Digital) memory card.

It is preferable that the above-mentioned small card adaptor further includes a card slot into which either of the communication card and the memory card is inserted.

It is preferable that the host apparatus is a host computer.

It is preferable that the host computer is a personal computer.

It is preferable that the host apparatus is any one of a digital camera, a PDA (Personal Digital Assistance), and a handy terminal.

It is preferable that the host apparatus includes application software that issues an application instruction for operating the small card; an operation system (OS) that issues an OS instruction for operating the small card based on the application instruction issued by the application software; and driver software that issues the instruction for operating the small card based on the OS instruction issued by the operation system.

It is preferable that the driver software issues the instruction based on the kind of the small card identified by the small card identifying portion.

In a host apparatus according to the present embodiment, there is provided driver software for issuing an instruction to be transferred to a small card based on a kind of the small card identified by a small card identifying portion provided in a small card adaptor. Therefore, the host apparatus issues an instruction to the small card in accordance with the kind of the inserted small card. Thus, the small card adaptor is not required to have a control program in accordance with the kind of the inserted small card. As a result, a host apparatus is obtained that can use an inexpensive small card adaptor capable of being operated with a plurality of kinds of small cards inserted therein.

It is preferable that the host apparatus according to the present embodiment further includes: application software that issues an application instruction for operating the small card; and an operation system (OS) that issues an OS instruction for operating the small card based on the application instruction issued by the application software, wherein the driver software issues the instruction based on the OS instruction issued by the operation system.

It is preferable that the application software includes browser software for the Internet and software for electronic mail.

It is preferable that the instruction issued by the driver software includes a command code and a parameter for giving an instruction to the small card, and the command code and the parameter are set in a plurality of registers provided in the controller.

It is preferable that the controller is provided with a CIS (Card Information Structure) information storing region in which CIS information is stored in accordance with the kind of the small card, and the operation system reads the CIS information stored in the CIS information storing region and sets up the driver software based on the read CIS information.

It is preferable that the host apparatus is a host computer.

It is preferable that the host computer is a personal computer.

It is preferable that the host apparatus is any one of a digital camera, a PDA (Personal Digital Assistance), and a handy terminal.

Hereinafter, the present invention will be described by way of illustrative embodiments with reference to the drawings.

FIG. 1 is a perspective view showing an outer appearance of a small card adaptor 100 according to the present embodiment and a personal computer 200 into which the small card adaptor 100 is inserted. The personal computer 200 includes an adaptor slot 7. The adaptor slot 7 is provided so as to receive the small card adaptor 100 having a substantially rectangular shape.

Figure 2:
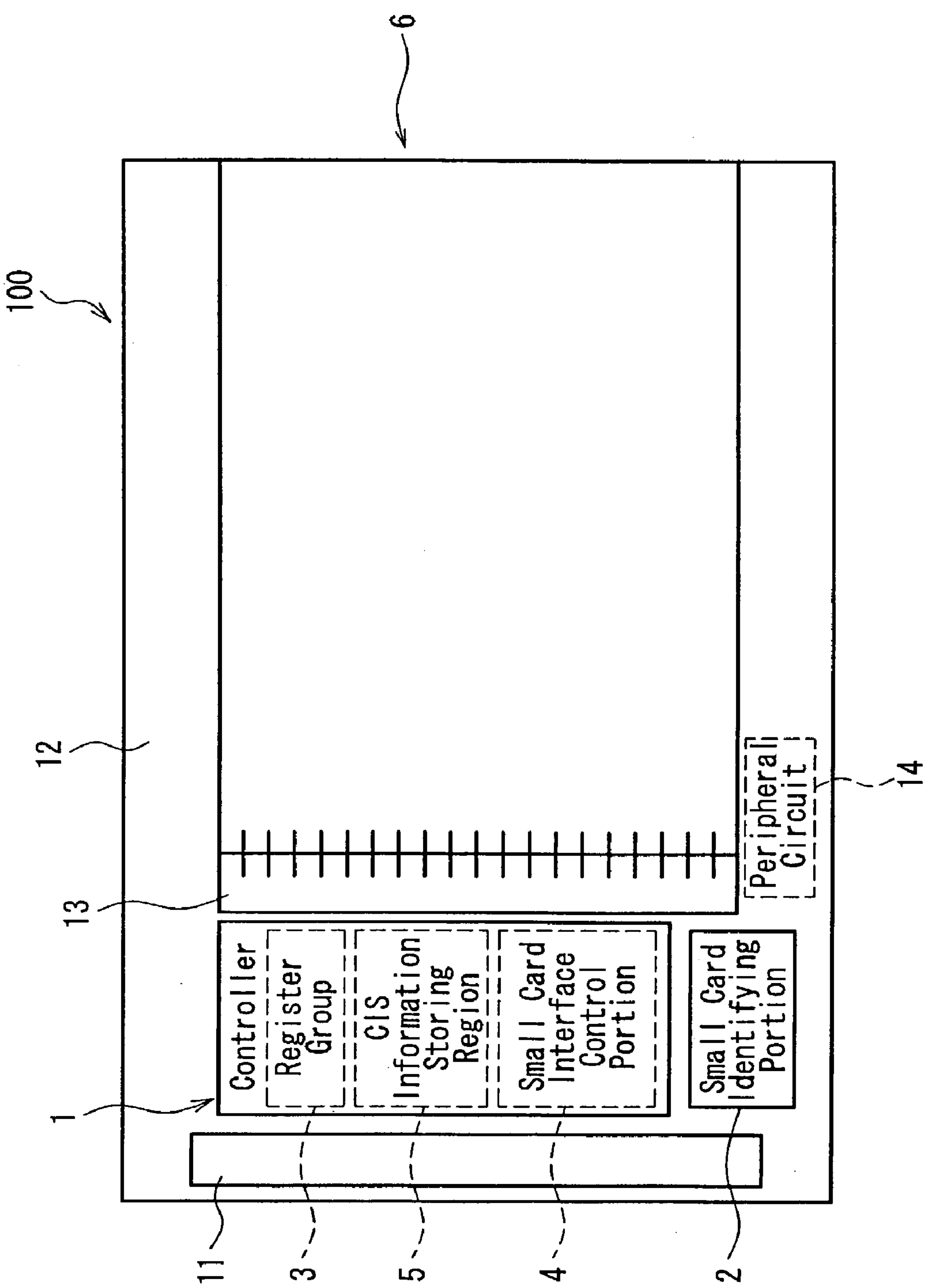
FIG. 2 is a plan view showing a configuration of the small card adaptor according to the present embodiment.

FIG. 2 is a plan view showing a configuration of the small card adaptor 100 according to the present embodiment. A connector 11 is provided on one side of the small card adaptor 100. The connector 11 is provided so as to be connected to a connector (not shown) provided in the adaptor slot 7 of the personal computer 200.

Figure 3:
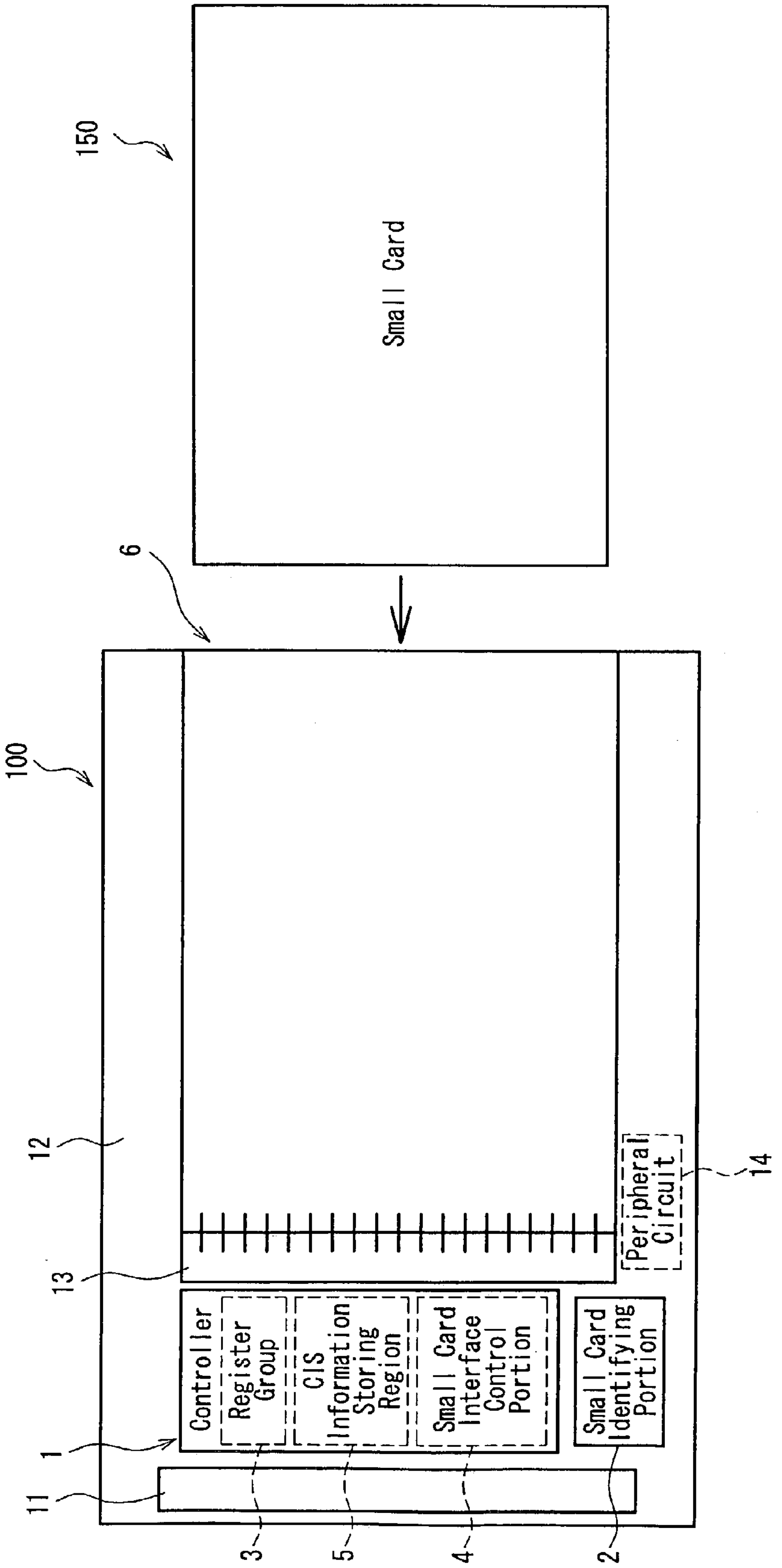
FIG. 3 is a plan view showing the small card adaptor according to the present embodiment before a small card is inserted therein.
Figure 4:
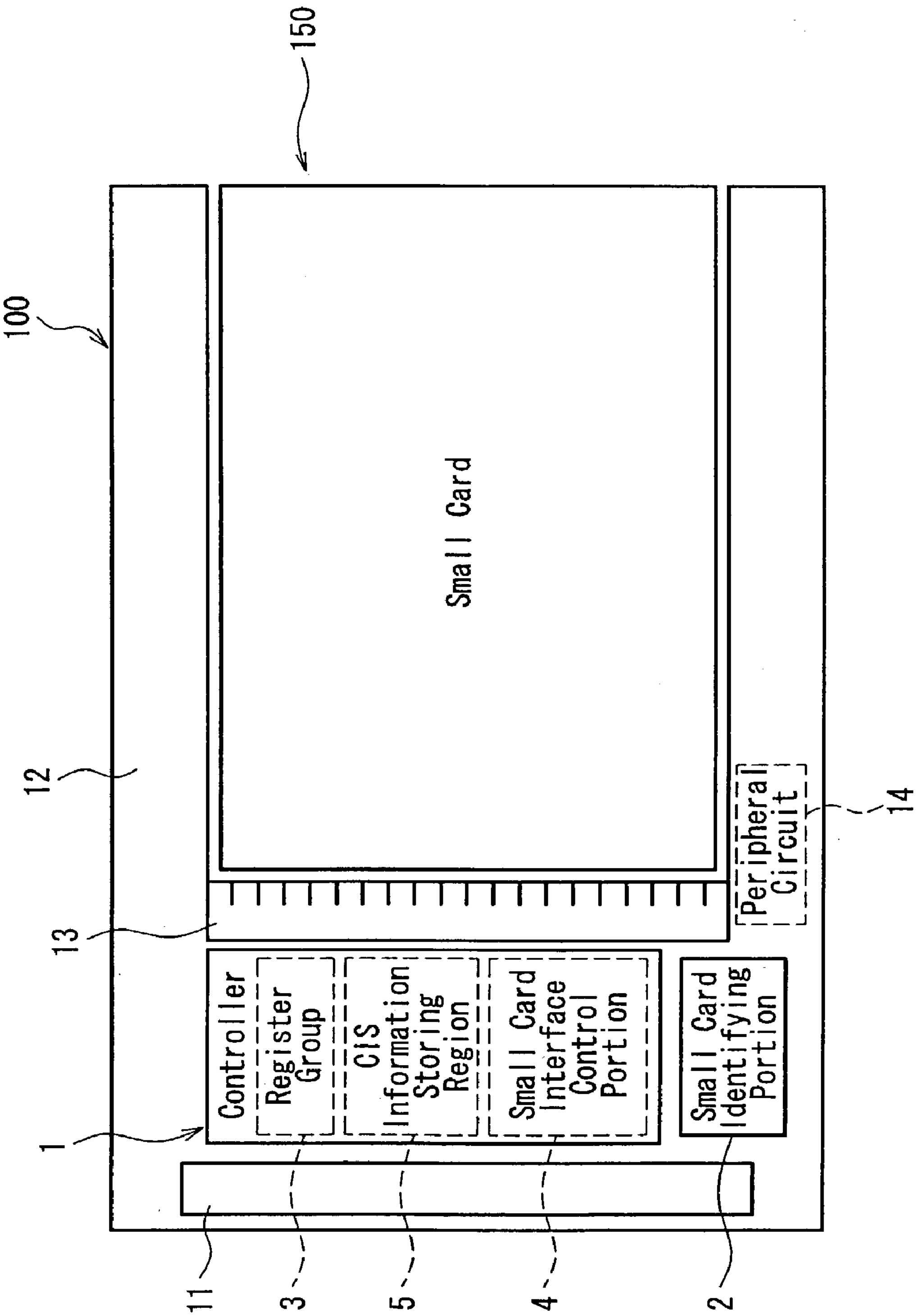
FIG. 4 is a plan view showing the small card adaptor according to the present embodiment in which a small card is inserted therein.

FIG. 3 is a plan view showing the small card adaptor 100 before a small card 150 is inserted therein. FIG. 4 is a plan view showing the small card adaptor 100 in which the small card 150 is inserted. A card slot 6 is formed on the other side of the small card adaptor 100. The card slot 6 is formed so as to receive the small card 150 having a rectangular shape smaller than that of the small card adaptor 100. The small card 150 is either a communication card such as a SD card type small communication card with a PHS communication function built therein for communication of the personal computer 200 through an electric communication line such as the Internet or a memory card such as a SD memory card for storing image data used by the personal computer 200. Examples of the communication card include a wireless LAN card, a PHS card, a LAN card, a GPS card, a Bluetooth card, a camera card, a scanner card, and an IO card, which are communicated through a wireless electric communication line. Herein, the LAN card refers to a card communicated through an electric communication line. The GPS card refers to a card for knowing geographic position information. The Bluetooth card refers to a card with a wireless communication function built therein, complying with the Bluetooth standards. The camera card refers to a card storing a function of taking a photograph and a function of storing data representing a photograph taken by a camera. The scanner card refers to a card storing a function of converting information in the form of a bar code or a paper sheet to reading data. The IO card refers to a card storing a function of inputting/outputting data.

In the present embodiment, an example in which either the above-mentioned communication card or the memory card is inserted in the small card adaptor 100 will be described.

A connector 13 is provided at the back of the card slot 6. The connector 13 is provided so as to be connected to a terminal (not shown) formed on an end face of the small card 150. Guides 12 are provided on both sides of the card slot 6. The guides 12 are provided so as to guide both side faces of the small card 150 so that the small card 150 is inserted into the card slot 6 smoothly.

The small card adaptor 100 is provided with a small card identifying portion 2. The small card identifying portion 2 is provided so as to identify whether the kind of the small card 150 inserted in the card slot 6 provided in the small card adaptor 100 is a communication card or a memory card.

For example, in the case where a memory card to be inserted into the card slot 6 is a SD memory card, and a communication card to be inserted into the card slot 6 is a SD card type communication card storing a PHS communication function, a command such as CMD5 and ACMD 41 is issued to the small card 150 inserted in the card slot 6 based on a SDIO Card Specification, and a Response from the small card 150 thereto is confirmed. Thus, the kind of the small card 150 inserted in the card slot 6 can be identified to be a communication card or a memory card.

The small card adaptor 100 is provided with a controller 1. The controller 1 has a register group 3. The register group 3 is composed of a plurality of registers provided based on the PC card ATA standards interface. The register group 3 includes, for example, a Feature Register, a Sector Count Register, a Sector Number Register, a Cylinder Low Register, a Cylinder High Register, a Drive/Head Register, a Command Register, an Error Register, a Device Control Register, a Drive Address Register, a Status Register, and a Data Register.

Each register is configured so as to be read/rewritten from the personal computer 200. An instruction including a command code and parameters issued by the personal computer 200 based on the kind of the small card 150 identified by the small card identifying portion 2 is set in each register.

The controller 1 includes a CIS information storing region 5. The CIS information storing region 5 stores CIS information. The CIS information stored in the CIS information storing region 5 has its contents changed depending on whether the kind of the small card 150 inserted in the card slot 6 is a communication card or a memory card. For example, in the CIS information storing region 5, CIS information for a memory card is stored previously so as to be read by an operation system 9 of the personal computer 200. When a communication card is inserted, data is generated based on the information stored in the inserted communication card, the CIS information stored in the CIS information storing region 5 is replaced partially by generated data, the replaced CIS information is read by the operation system 9 of the personal computer 200, and driver software for the inserted communication card is set.

The controller 1 has a small card interface control portion 4. The small card interface control portion 4 is provided so as to transfer a command code and parameters respectively set in a plurality of registers constituting the register group 3 to the small card 150. A peripheral circuit 14 is provided in the small card adaptor 100. The peripheral circuit 14 is provided so as to operate the controller 1. The interface provided in the small card 150 is configured so as to comply with the SD card standards interface.

Figure 5:
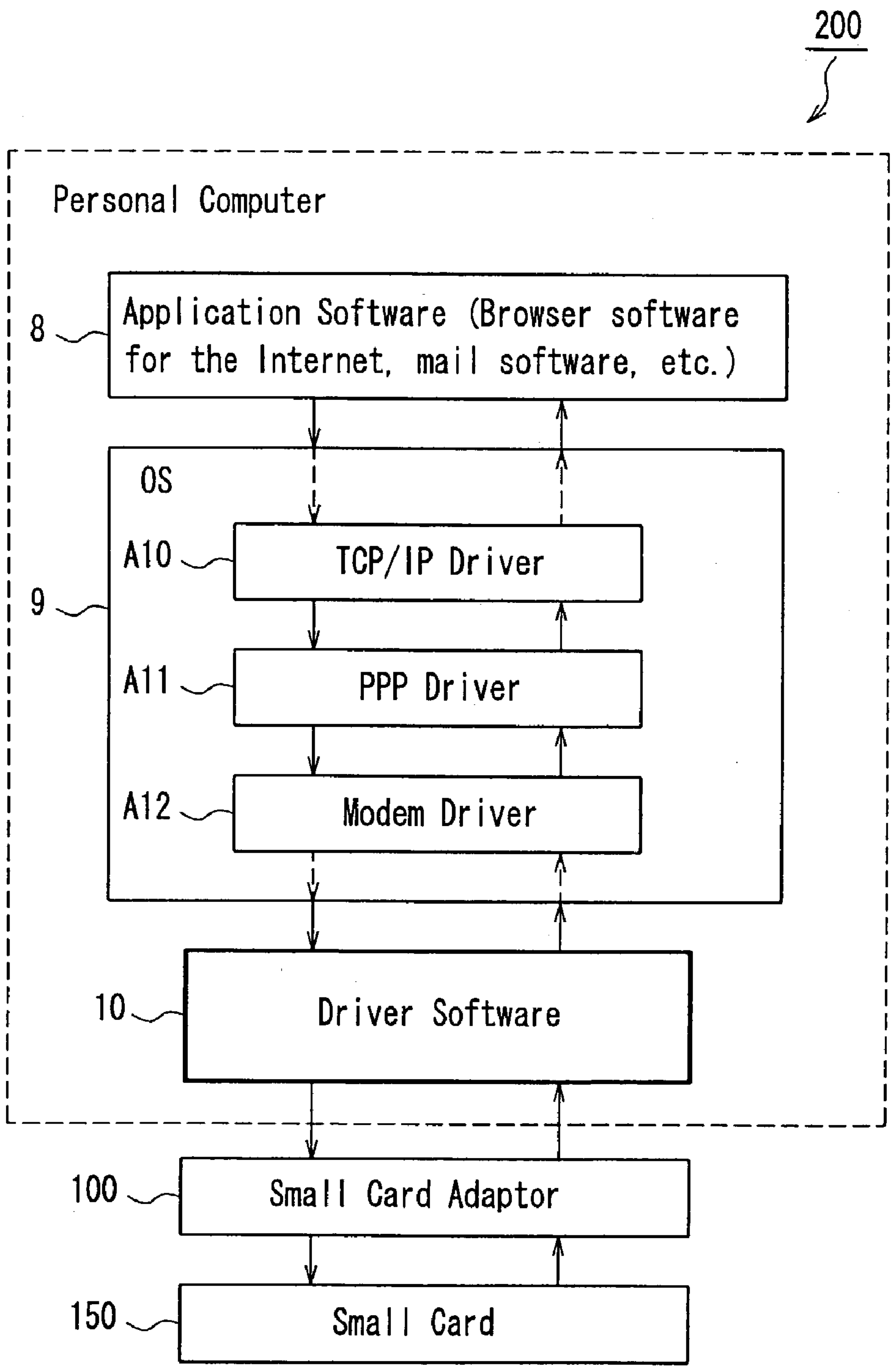
FIG. 5 is a block diagram illustrating a configuration of a personal computer according to the present embodiment.

FIG. 5 is a block diagram illustrating a configuration of the personal computer 200 according to the present embodiment. The personal computer 200 includes application software 8. The application software 8 has browser software having a communication function for connection to the Internet and electronic mail software, and issues an application instruction for operating the small card 150 inserted in the small card adaptor 100.

The personal computer 200 is provided with an operation system (OS) 9. The operation system 9 includes, for example, a TCP/IP driver A10, a PPP driver A11, and a modem driver A12 as a part of the function of the OS, and issues an OS instruction for operating the small card 150 based on the application instruction issued by the application software 8.

The personal computer 200 has driver software 10. The driver software 10 issues an instruction for operating the small card 150, based on the OS instruction issued by the operation system 9 and the kind of the small card 150 identified by the small card identifying portion 2 provided in the small card adaptor 100.

Figure 6:
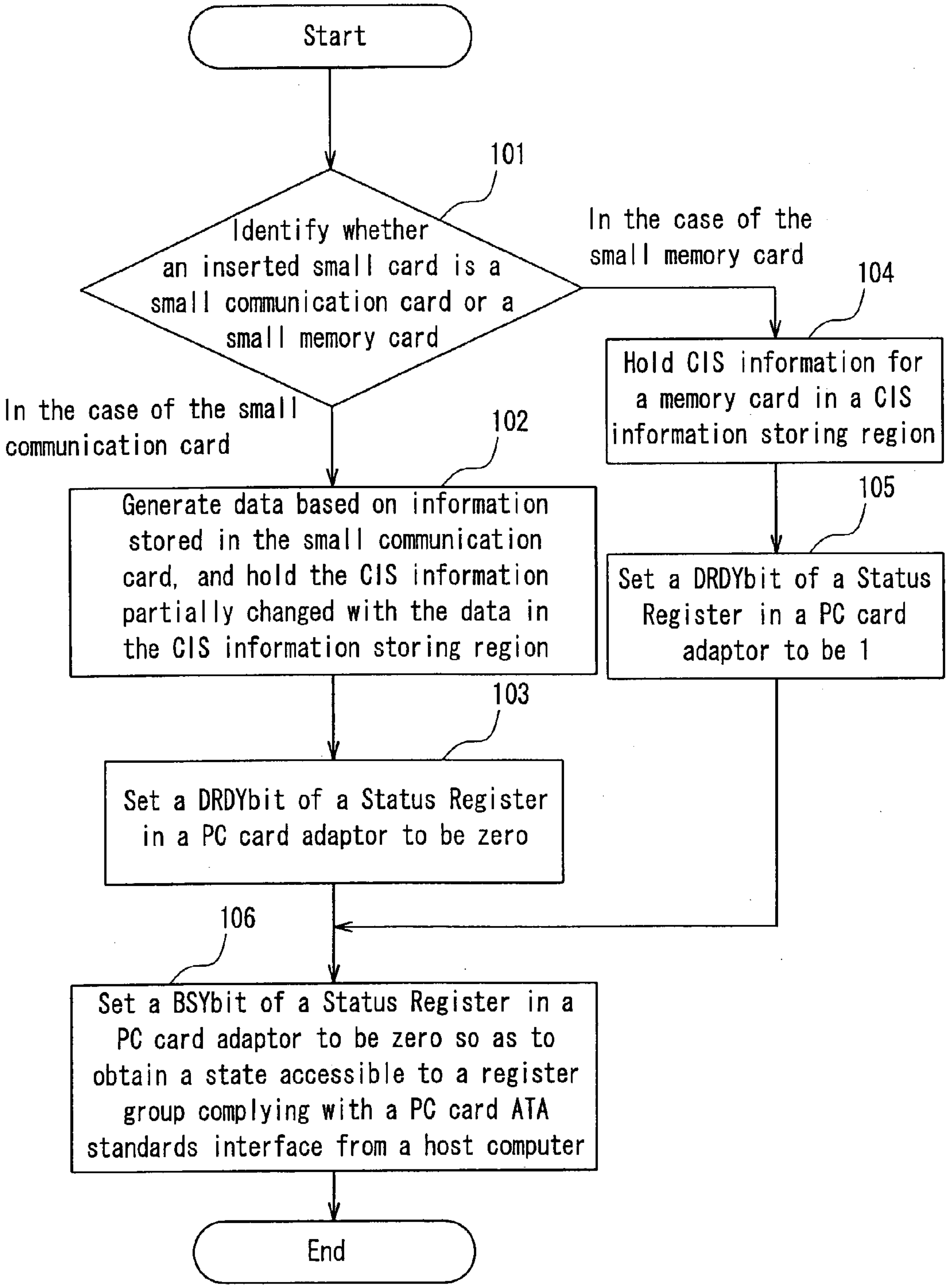
FIG. 6 is a flow chart illustrating an operation of the small card adaptor according to the present embodiment.

The operations of the small card adaptor 100 and the personal computer 200 thus configured will be described. FIG. 6 is a flow chart illustrating the operation of the small card adaptor 100.

When the small card 150 is inserted in the card slot 6 provided in the small card adaptor 100, and the small card adaptor 100 with the small card 150 inserted therein is connected to the adaptor slot 7 provided in the personal computer 200, the small card identifying portion 2 provided in the small card adaptor 100 identifies the kind of the inserted small card to be a communication card or a memory card (Operation 101).

When the kind of the inserted small card 150 is identified to be a communication card, data is generated based on the information stored in the small communication card, and the CIS information for a memory card is partially changed using the generated data to hold the changed CIS information in the CIS information storing region (Operation 102).

Next, a DRDYbit of a Status Register in the register group 3 provided in the small card adaptor 100 is set to be zero (Operation 103). When the kind of the inserted small card 150 is identified to be a memory card, the CIS information for a memory card is stored and held in the CIS information storing region 5 (Operation 104). Then, a DRDYbit of a Status Register in the register group 3 is set to be 1 (Operation 105).

Then, a BSYbit of a Status Register in the register group 3 provided in the small card adaptor 100 is set to be zero, whereby the driver software 10 provided in the personal computer 200 is put in a state capable of accessing the register group 3 complying with the PC card ATA standards interface (Operation 106).

Then, the operation system 9 of the personal computer 200 reads the CIS information from the CIS information storing region 5 provided in the small card adaptor 100, and sets up the driver software 10 based on the CIS information. The CIS information stored in the CIS information storing region 5 is varied depending upon whether the small card 150 inserted in the small card adaptor 100 is a small memory card or a small communication card. Therefore, the driver software 10 is set up in accordance with the kind of the small card 150 inserted in the small card adaptor 100.

The application software 8 provided in the personal computer 200 issues an application instruction for operating the small card 150 inserted in the small card adaptor 100.

Then, the operation system 9 issues an OS instruction for operating the small card 150, based on the application instruction issued by the application software 8.

The driver software 10 set up in accordance with the kind of the small card 150 issues an instruction to be transferred to the small card 150, based on the OS instruction issued by the operation system 9 and the kind of the small card 150 identified by the small card identifying portion 2 provided in the small card adaptor 100. The instruction issued by the driver software 10 includes a command code and parameters for instructing the small card 150, and the command code and parameters are set in a plurality of registers of the register group 3 provided in the controller 1 of the small card adaptor 100.

FIG. 7 shows examples of parameters set in the register group 3 of the controller 1 provided in the small card adaptor 100 by the driver software 10 according to the present embodiment.

For example, a command code set in a Command Index of a SD card type small card with a PHS communication function built therein, parameters such as the value of an Argument, the transfer direction and the number of transfer data required for operating the small card adaptor 100 are set in a Feature Register, a Sector Count Register, a Sector Number Register, a Cylinder Low Register, a Cylinder High Register, and a Drive/Head Register used in the PC card ATA standards interface. Thereafter, a particular command is written in the Command Register, and data to be transferred to the small card 150 is rewritten in the Data Register. Thus, an instruction is set so as to be given from the small card adaptor 100 to the small card 150.

As a representative example, the case will be described where the SD card type small card with a PHS communication function built therein is inserted as the small card 150 in the small card adaptor 100. After a user has sent data, the application software 8 sends an application instruction for instructing the operation system 9 to send data. The operation system 9 that has received the application instruction instructs the driver software 10 to write the data in the Transmitter Holding Register. Then, the driver software 10 generates a command code to be set in a Command Index for access to the Transmitter Holding Register provided in the SD card type small card with a PHS communication function built therein, parameters such as an Argument used with the command code, and the transfer direction and the number of transfer data required for operating the small card adaptor 100, and transfers them to the small card adaptor 100.

Then, the small card interface control portion 4 transfers the command code and parameters respectively set in a plurality of registers of the register group 3 to the small card 150. The small card 150 sets the result obtained by executing predetermined processing based on the transferred command code and parameters in each register of the register group 3. Thereafter, the small card interface control portion 4 transfers the result set in each register of the register group 3 to the driver software 10 provided in the personal computer 200.

The driver software 10 converts the transferred processing result into a data format that can be interpreted by the operation system 9, and gives it to the operation system 9. The operation system 9 converts the processing result received from the driver software 10 into a data format that can be interpreted by the application software 8, and gives it to the application software 8. Thereafter, the application software 8 performs the subsequent processing based on the processing result received from the operation system 9.

A series of steps from the issuance of the application instruction from the application software 8 to the reception of the processing result by the application software 8 are repeated a plurality of times, whereby a user can confirm a homepage on the Internet and exchange electronic mail using electronic mail software.

Thus, in the case where a small memory card is inserted in the small card adaptor 100, the small memory card can be operated in the same way as in the conventional small card adaptor dedicated to a small memory card based on the PC card ATA standards interface control procedure. In addition, in the case where a small communication card is inserted, data can be exchanged between the small communication card and the personal computer 100 using the register group 3 used in a PC card interface.

As described above, according to the present embodiment, the controller 1 receives an instruction issued by the driver software 10 of the personal computer 200 based on the kind of the small card 150 identified by the small card identifying portion 2, and transfers the received instruction to the small card 150. Therefore, the driver software 10 issues an instruction to the small card 150 in accordance with the kind of the inserted small card 150. Thus, the small card adaptor 100 is not required to have control programs in accordance with the kind of the inserted small card 150. As a result, an inexpensive small card adaptor can be obtained, which is capable of accepting a plurality of kinds of small cards 150 for operation.

The small card adaptor 100 according to the present embodiment also can operate a new small communication card put on the market after the small card adaptor 100 according to the present embodiment has been shipped. More specifically, driver software for a new small communication card is open to the public on the Internet. A user downloads the driver software to the personal computer 200. Then, the user installs the downloaded driver software in the personal computer 200 as the driver software 10. When the driver software 10 is configured in this manner, an instruction from the operation system 9 can be converted to an instruction compatible with the small card adaptor 100 and a new small communication card connected to the end thereof.

The case has been described in which, when a small memory card is inserted in a small card adaptor, the small card adaptor is operated in the same way as in a conventional small card adaptor dedicated to a small memory card. However, the present invention is not limited thereto. It should be appreciated that, in the case of a small card adaptor with a small memory card inserted therein, the same effect can be obtained even when the small card adaptor is configured so as to receive an instruction from an OS and to be controlled by driver software converting the instruction for a small memory card.

Furthermore, it also should be appreciated that the same effect can be obtained even in a configuration in which parameters such as a command code with respect to a small communication card are generated in a small card adaptor, whereby the small card adaptor with a small memory card inserted therein is controlled by driver software in the same way as in a conventional small card adaptor dedicated to a small communication card.

As described above, according to the present invention, it is possible to provide a small card adaptor in which driver software for a small card inserted in a small card adaptor is changed appropriately so as to operate normally, whose a production cost is decreased, and a host apparatus into which the small card adaptor is inserted.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A small card adaptor into which a small card is inserted so as to be connected to a host apparatus, comprising:

a small card identifying portion for identifying a kind of the inserted small card; and a controller, including a plurality of registers configured so as to comply with a PC card ATA standards interface, and for setting a command code and a parameter, and including a Status Register provided with a DRDYbit, and a small card interface control portion for transferring the command code and the parameter set in the plurality of registers to the small card, wherein the controller is configured for receiving an instruction, including the command code and the parameter for giving an instruction to the small card, issued by the host apparatus based on the kind of the small card identified by the small card identifying portion, transferring the received instruction to the small card, and giving a result of processing performed by the small card, based on the instruction transferred from the controller, to the host apparatus, wherein the small card is selected from a communication card for communication of the host apparatus through an electric communication line or a memory card for storing image data, the host apparatus sets the DRDYbit provided in the Status Register in accordance with the result of identification of the kind of the small card by the small card identifying portion, when the kind of the small card identified by the small card identifying portion is the communication card, the host apparatus sets a DRDYbit provided in a Status Register to be zero, and when the kind of the small card identified by the small card identifying portion is the memory card, the host apparatus sets the DRDYbit provided in the Status Register to be 1, the small card adaptor is inserted into an adaptor slot provided in the host apparatus, the small card is inserted into a card slot provided in the small card adaptor, the controller is provided with a CIS (Card Information Structure) information storing region in which CIS information is stored in accordance with the kind of the small card, and the host apparatus reads the CIS information stored in the CIS information storing region, and issues the instruction based on the read CIS information.

2. A small card adaptor according to claim 1, wherein the communication card is communicated through a wireless electric communication line.

3. A small card adaptor according to claim 1, wherein the communication card is any one selected from the group consisting of a wireless LAN card, a PHS card, a modem card, a LAN card, a GPS card, a Bluetooth card, a camera card, a scanner card, and an IO card.

4. A small card adaptor according to claim 1, wherein the memory card is a SD (Secure Digital) memory card.

5. A small card adaptor according to claim 1, further comprising a card slot into which either of the communication card and the memory card is inserted.

6. A small card adaptor according to claim 1, wherein the host apparatus is a host computer.

7. A small card adaptor according to claim 6, wherein the host computer is a personal computer.

8. A small card adaptor according to claim 1, wherein the host apparatus is any one of a digital camera, a PDA (Personal Digital Assistance), and a handy terminal.

9. A small card adaptor according to claim 1, wherein the host apparatus includes application software that issues an application instruction for operating the small card;

an operation system (OS) that issues an OS instruction for operating the small card based on the application instruction issued by the application software; and driver software that issues the instruction for operating the small card based on the OS instruction issued by the operation system.

10. A small card adaptor according to claim 9, wherein the driver software issues the instruction based on the kind of the small card identified by the small card identifying portion.

11. A small card or according to claim 9, wherein the application of software includes browser software for the Internet and software for electronic mail.

12. A host apparatus into which the small card adaptor of claim 1 is inserted, comprising:

an adaptor slot for receiving the small card adaptor; and driver software for issuing the instruction to be transferred to the small card based on the kind of the small card identified by the small card identifying portion provided in the small card adaptor.

13. A host apparatus according to claim 12, further comprising:

application software that issues an application instruction for operating the small card; and an operation system (OS) that issues an OS instruction for operating the small card based on the application instruction issued by the application software, wherein the driver software issues the instruction based on the OS instruction issued by the operation system.

14. A host apparatus according to claim 13, wherein the application software includes browser software for the Internet and software for electronic mail.

15. A host apparatus according to claim 12, wherein the instruction issued by the driver software includes a command code and a parameter for giving an instruction to the small card.

16. A host apparatus according to claim 12, wherein the controller is provided with a CIS (Card Information Structure) information storing region in which CIS information is stored in accordance with the kind of the small card, and the operation system reads the CIS information stored in the CIS information storing region, and sets up the driver software based on the read CIS information.

17. A host apparatus according to claim 12, wherein the host apparatus is a host computer.

18. A host apparatus according to claim 17, wherein the host computer is a personal computer.

19. A host apparatus according to claim 12, wherein the host apparatus is any one of a digital camera, a PDA (Personal Digital Assistance), and a handy terminal.

20. A small card adaptor according to claim 1, wherein the plurality of registers complying with the PC card ATA standards interface comprises a Feature Register, a Sector Count Register, a Sector Number Register, a Cylinder Low Register, a Cylinder High Register, a Drive/Head Register, a Command Register, an Error Register, a Device Control Register, a Drive Address Register, a Status Register, and a Data Register, and the communication card or the memory card is controlled by operating the communication card or the memory card, using at least two of the registers that are physically identical with each other.

* * * * *